(12) United States Patent
Peng et al.

(10) Patent No.: US 12,016,173 B2
(45) Date of Patent: Jun. 18, 2024

(54) SEMICONDUCTOR DEVICE AND MANUFACTURING METHOD THEREOF

(71) Applicant: Winbond Electronics Corp., Taichung (TW)

(72) Inventors: Te-Hsuan Peng, Taichung (TW); Kai Jen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 270 days.

(21) Appl. No.: 17/388,033

(22) Filed: Jul. 29, 2021

(65) Prior Publication Data
US 2022/0068930 A1    Mar. 3, 2022

(30) Foreign Application Priority Data
Aug. 27, 2020 (TW) .................................. 109129394

(51) Int. Cl.
*H10B 12/00*      (2023.01)
*H01L 21/311*      (2006.01)
(Continued)

(52) U.S. Cl.
CPC ........ *H10B 12/31* (2023.02); *H01L 21/31144* (2013.01); *H01L 21/76802* (2013.01);
(Continued)

(58) Field of Classification Search
CPC ......... H01L 21/76802; H01L 21/76877; H01L 28/75; H01L 28/90; H10B 12/31; H10B 12/09; H10B 12/033; H10B 12/03
See application file for complete search history.

(56) References Cited

U.S. PATENT DOCUMENTS

| | | | | |
|---|---|---|---|---|
| 5,739,068 A | * | 4/1998 | Jost | ................... H01L 21/76802 257/E21.018 |
| 6,426,255 B1 | * | 7/2002 | Asano | ..................... H10B 12/09 257/295 |

(Continued)

FOREIGN PATENT DOCUMENTS

| | | |
|---|---|---|
| JP | 2015154028 | 8/2015 |
| JP | 2015216174 | 12/2015 |
| TW | I231973 | 5/2005 |

OTHER PUBLICATIONS

Bhushan Sopori et al., "Silicon device processing in H-ambients: H-diffusion mechanisms and influence on electronic properties," Journal of Electronic Materials, vol. 30, No. 12, Dec. 2001, pp. 1616-1627.

(Continued)

*Primary Examiner* — Bac H Au
(74) *Attorney, Agent, or Firm* — JCIPRNET

(57) ABSTRACT

A semiconductor device including a substrate, a capacitor, a stop layer, a first contact, and a second contact is provided. The substrate includes a memory array region and a peripheral circuit region. The capacitor is located in the memory array region. The capacitor includes a first electrode, a second electrode, and an insulating layer. The second electrode is located on the first electrode. The insulating layer is located between the first electrode and the second electrode. The stop layer is located on the second electrode in the memory array region and extends into the peripheral circuit region. A material of the stop layer is not a conductive material. The first contact is located in the memory array region, passes through the stop layer, and is electrically connected to the second electrode. The second contact is located in the peripheral circuit region and passes through the stop layer.

14 Claims, 11 Drawing Sheets

(51) Int. Cl.
*H01L 21/768* (2006.01)
*H01L 49/02* (2006.01)

(52) U.S. Cl.
CPC ........ *H01L 21/76877* (2013.01); *H01L 28/75* (2013.01); *H10B 12/033* (2023.02)

(56) References Cited

U.S. PATENT DOCUMENTS

| | | | |
|---|---|---|---|
| 6,544,834 B1 * | 4/2003 | Sugawara | H01L 28/40 |
| | | | 257/E27.088 |
| 7,396,772 B2 | 7/2008 | Lee et al. | |
| 2002/0045309 A1 * | 4/2002 | Yoshida | H01L 21/823871 |
| | | | 257/E21.507 |
| 2002/0140017 A1 * | 10/2002 | Takata | H10B 12/09 |
| | | | 257/E21.585 |
| 2003/0049903 A1 * | 3/2003 | Mitani | H01L 28/91 |
| | | | 257/E21.018 |
| 2010/0129978 A1 | 5/2010 | Kim | |
| 2012/0025347 A1 | 2/2012 | Choi | |
| 2015/0357335 A1 | 12/2015 | Kunishima et al. | |
| 2018/0166529 A1 * | 6/2018 | Park | H10B 12/033 |
| 2018/0190658 A1 * | 7/2018 | Chen | H01L 28/91 |
| 2019/0057935 A1 * | 2/2019 | Nagai | H01L 23/535 |
| 2020/0098763 A1 * | 3/2020 | Bae | H01L 21/3212 |

OTHER PUBLICATIONS

"Office Action of Taiwan Counterpart Application", dated Apr. 7, 2021, p. 1-p. 6.

* cited by examiner

SEMICONDUCTOR DEVICE AND MANUFACTURING METHOD THEREOF

CROSS-REFERENCE TO RELATED APPLICATION

This application claims the priority benefit of Taiwan application serial no. 109129394, filed on Aug. 27, 2020. The entirety of the above-mentioned patent application is hereby incorporated by reference herein and made a part of this specification.

BACKGROUND OF THE INVENTION

Field of the Invention

The invention relates to a semiconductor device and a manufacturing method thereof, and particularly relates to a semiconductor device having a capacitor and a manufacturing method thereof.

Description of Related Art

Currently, in the manufacturing process of the semiconductor device, the hydrogen sintering ($H_2$ sintering) process is used to reduce dangling bonds to increase the electrical performance of the semiconductor device. In some semiconductor devices (e.g., a dynamic random access memory (DRAM)), the upper electrode of the capacitor includes a boron-doped SiGe (B-doped SiGe) layer and a tungsten layer, wherein the tungsten layer can be used as an etching stop layer in the process of forming the contact. However, during the $H_2$ sintering process, the tungsten layer forms a strong barrier to hydrogen penetration into the silicon substrate and hinders the $H_2$ sintering process.

The current solution is to omit the tungsten layer in the upper electrode, so that the $H_2$ sintering process can proceed successfully. As a result, the thickness of the B-doped SiGe layer must be increased due to the lack of the tungsten layer as an etching stop layer in the process of forming the contact. However, the thicker B-doped SiGe layer has poor uniformity between different memory array regions, thereby reducing the electrical performance of the semiconductor device.

SUMMARY OF THE INVENTION

The invention provides a semiconductor device and a manufacturing method thereof, which can improve the electrical performance of the semiconductor device.

The invention provides a semiconductor device, which includes a substrate, a capacitor, a stop layer, a first contact, and a second contact. The substrate includes a memory array region and a peripheral circuit region. The capacitor is located in the memory array region. The capacitor includes a first electrode, a second electrode, and an insulating layer. The first electrode is located on the substrate. The second electrode is located on the first electrode. The insulating layer is located between the first electrode and the second electrode. The stop layer includes a first portion located on the second electrode in the memory array region and a second portion located in the peripheral circuit region, wherein the first portion extends to the second portion, a material of the stop layer is not a conductive material, and a top surface of the first portion is higher than a top surface of the second portion. The first contact is located in the memory array region, passes through the stop layer, and is electrically connected to the second electrode. The second contact is located in the peripheral circuit region and passes through the stop layer.

The invention provides a manufacturing method of a semiconductor device, which includes the following steps. A substrate is provided. The substrate includes a memory array region and a peripheral circuit region. A capacitor is formed on the substrate in the memory array region. The capacitor includes a first electrode, a second electrode, and an insulating layer. The first electrode is located on the substrate. The second electrode is located on the first electrode. The insulating layer is located between the first electrode and the second electrode. A stop layer is simultaneously formed in the memory array region and the peripheral circuit region. A stop layer is located on the second electrode. A material of the stop layer is not a conductive material. After forming the stop layer, a planarization layer is formed on the stop layer. A first contact is formed in the memory array region, and a second contact is formed in the peripheral circuit region. The first contact and the second contact pass through the planarization layer and the stop layer. The first contact is electrically connected to the second electrode.

Based on the above description, in the semiconductor device and the manufacturing method thereof according to the invention, since the stop layer can be used as an etching stop layer in the process of forming the first contact and the second contact, there is no need to increase the thickness of the second electrode. Therefore, the second electrode can have better uniformity between different memory array regions, thereby effectively increasing the electrical performance of the semiconductor device. In addition, since the material of the stop layer is not the conductive material, the stop layer will not hinder the subsequent $H_2$ sintering process, and the electrical performance of the semiconductor device can be increased by the $H_2$ sintering process.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
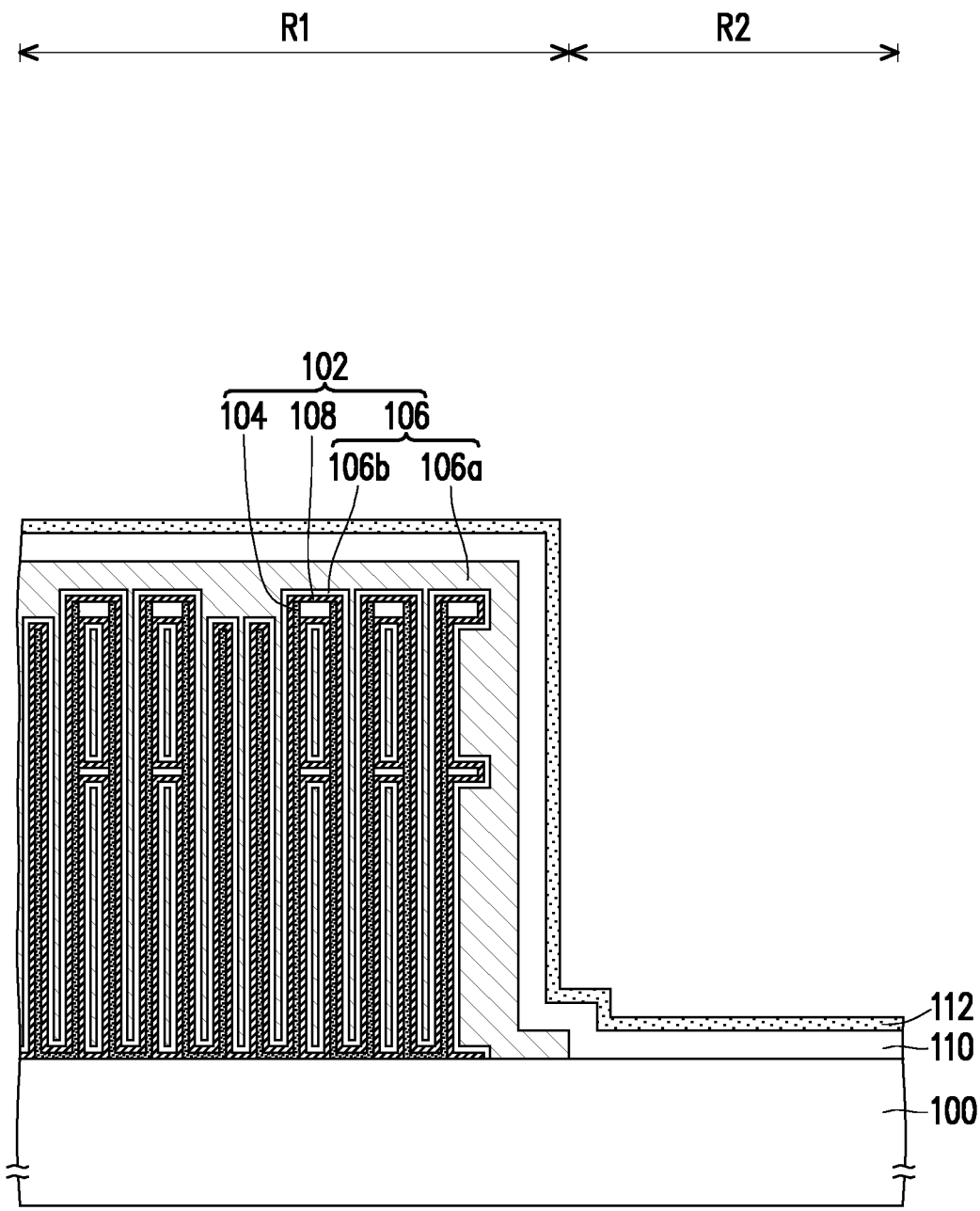
FIG. 1A to FIG. 1K are cross-sectional views illustrating a manufacturing process of a semiconductor device according to an embodiment of the invention.

Referring to FIG. 1A, a substrate 100 is provided. The substrate 100 may be a semiconductor substrate, such as a silicon substrate. The substrate 100 may include a memory array region R1 and a peripheral circuit region R2. In addition, depending on the type of the semiconductor device, there may be corresponding components on the substrate 100. In the present embodiment, the semiconductor device is, for example, a DRAM. In this case, there may be a corresponding transistor (not shown) on the substrate 100 in the memory array region R1, and there may be a corresponding active device (e.g., a sense amplifier) (not shown) on the substrate 100 in the peripheral circuit region R2. Furthermore, there may be a required dielectric layer (not shown) and a required interconnection structure (not shown), etc. on the substrate 100, and the description thereof is omitted here.

A capacitor 102 is formed on the substrate 100 in the memory array region R1. The capacitor 102 may be a cylinder capacitor, but the invention is not limited thereto. The capacitor 102 includes an electrode 104, an electrode 106, and an insulating layer 108. The electrode 104 is located on the substrate 100. The electrode 104 may be electrically connected to a corresponding transistor on the substrate 100. The material of the electrode 104 is, for example, titanium, titanium nitride, or a combination thereof. The electrode 106 is located on the electrode 104. The electrode 106 may be a single-layer structure or a multilayer structure. In the present embodiment, the electrode 106 is, for example, a multilayer structure. For example, the electrode 106 may include a conductive layer 106a and a conductive layer 106b. The material of the conductive layer 106a is, for example, a doped semiconductor material, such as a B-doped SiGe layer. The conductive layer 106b is located between the conductive layer 106a and the insulating layer 108. The material of the conductive layer 106b is, for example, titanium, titanium nitride, or a combination thereof. The insulating layer 108 is located between the electrode 104 and the electrode 106. The material of the insulating layer 108 may be a dielectric material, such as a high dielectric constant (high-k) material.

A buffer layer 110 may be formed in the memory array region R1 and the peripheral circuit region R2. The buffer layer 110 may be located on the electrode 106 in the memory array region R1 and the substrate 100 in the peripheral circuit region R2. The material of the buffer layer 110 is, for example, oxide. In some embodiments, the material of the buffer layer 110 is silicon oxide, such as tetraethoxysilane (TEOS) oxide, spin on glass (SOG), or borophosphosilicate glass (BPSG).

A stop layer 112 is simultaneously formed in the memory array region R1 and the peripheral circuit region R2. The stop layer 112 is located on the electrode 106 in the memory array region R1 and extends into the peripheral circuit region R2. The stop layer 112 may extend along the sidewall of the capacitor 102. The material of the stop layer 112 is not a conductive material. In the present embodiment, the stop layer 112 may be located on the buffer layer 110. The material of the stop layer 112 is, for example, nitride, such as silicon nitride or silicon oxynitride (SiON).

Figure 1B:
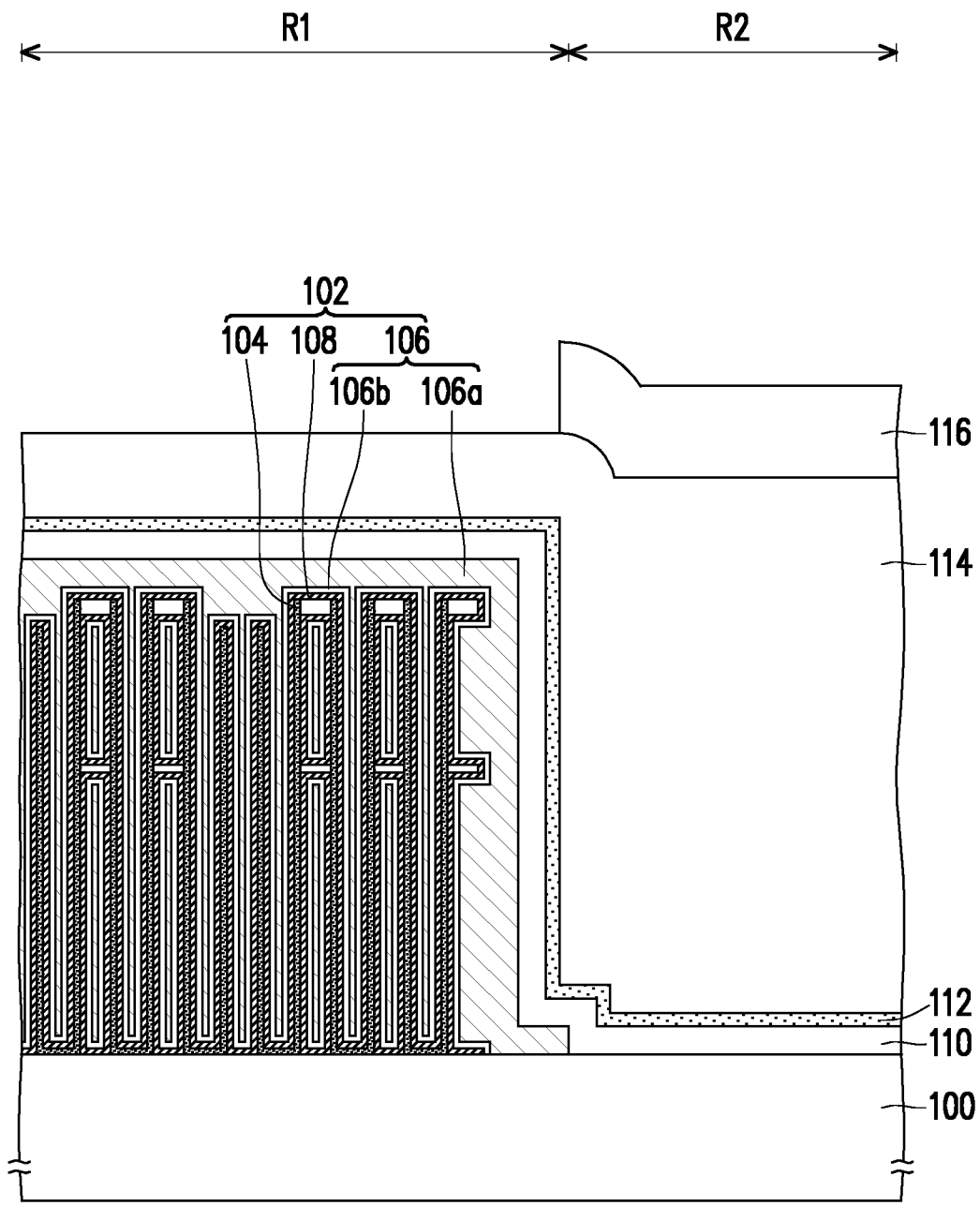

Referring to FIG. 1B, a planarization material layer 114 may be formed on the stop layer 112. The material of the planarization material layer 114 is, for example, oxide. In some embodiments, the material of the planarization material layer 114 is, for example, silicon oxide, such as TEOS oxide, SOG, or BPSG. A patterned photoresist layer 116 may be formed on the planarization material layer 114. The patterned photoresist layer 116 exposes the planarization material layer 114 in the memory array region R1. The patterned photoresist layer 116 may be formed by a lithography process.

Figure 1C:
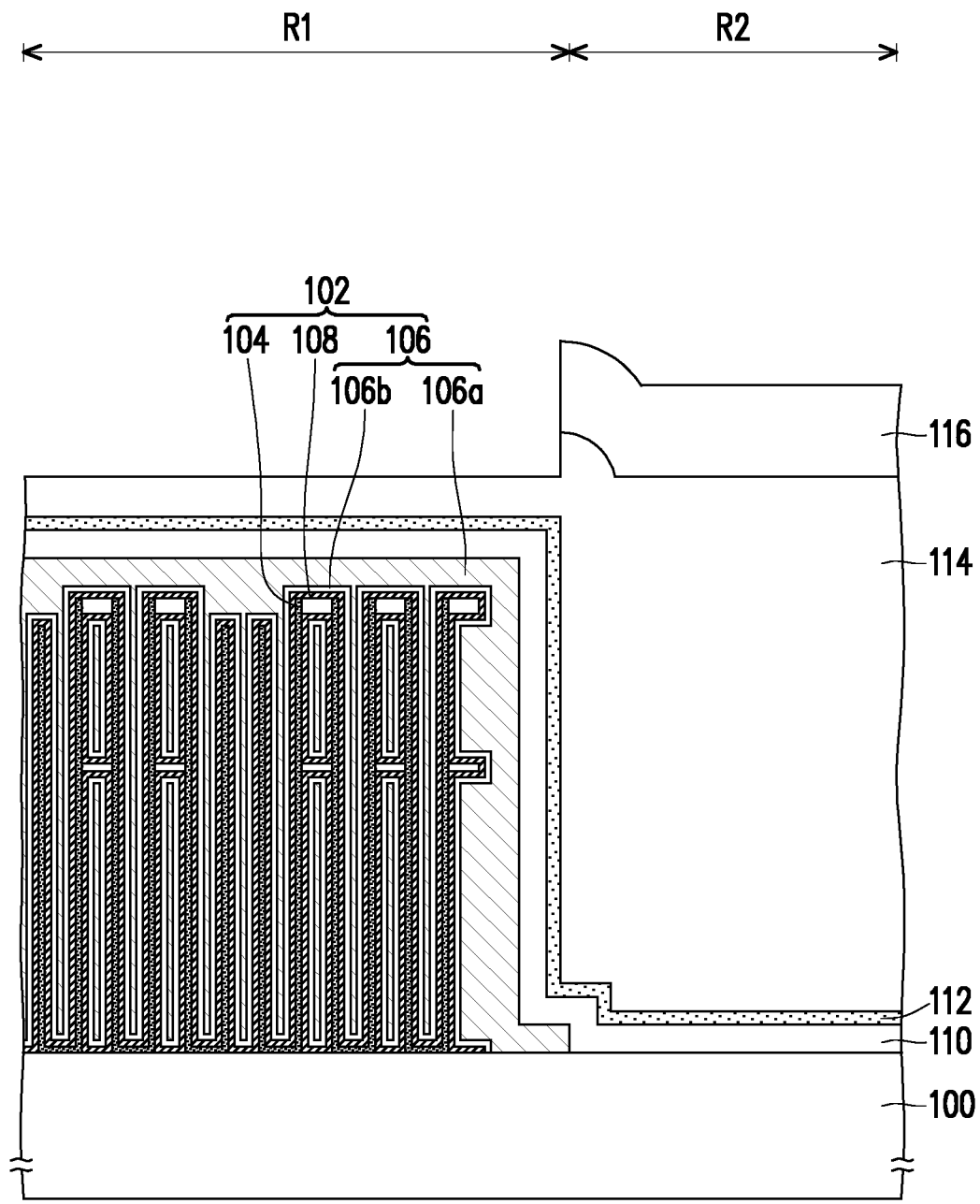

Referring to FIG. 1C, a portion of the planarization material layer 114 exposed by the patterned photoresist layer 116 may be removed to reduce the height of the planarization material layer 114 in the memory array region R1. The method of removing the portion of the planarization material layer 114 is, for example, a dry etching method.

Figure 1D:
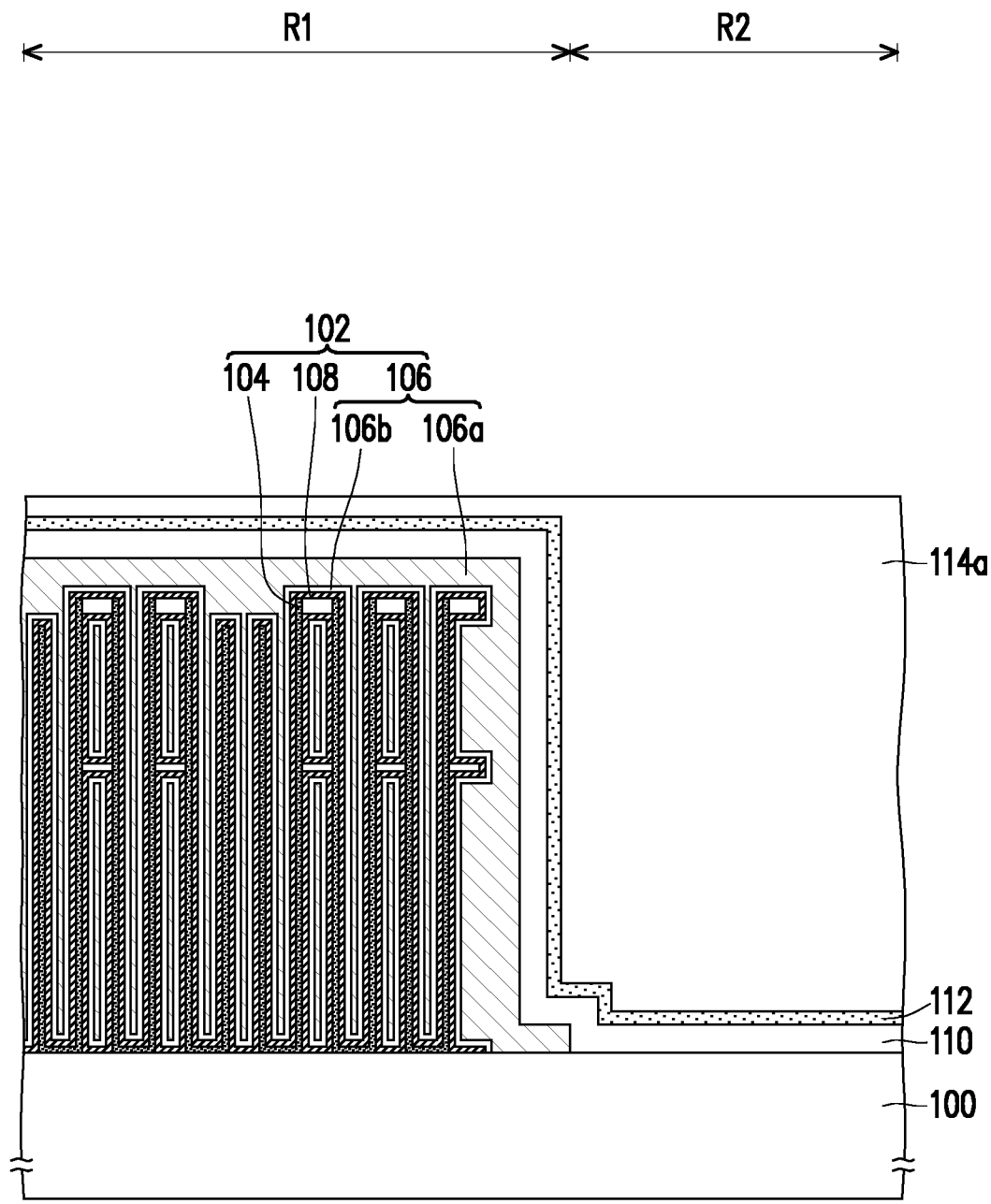
Figure 1E:
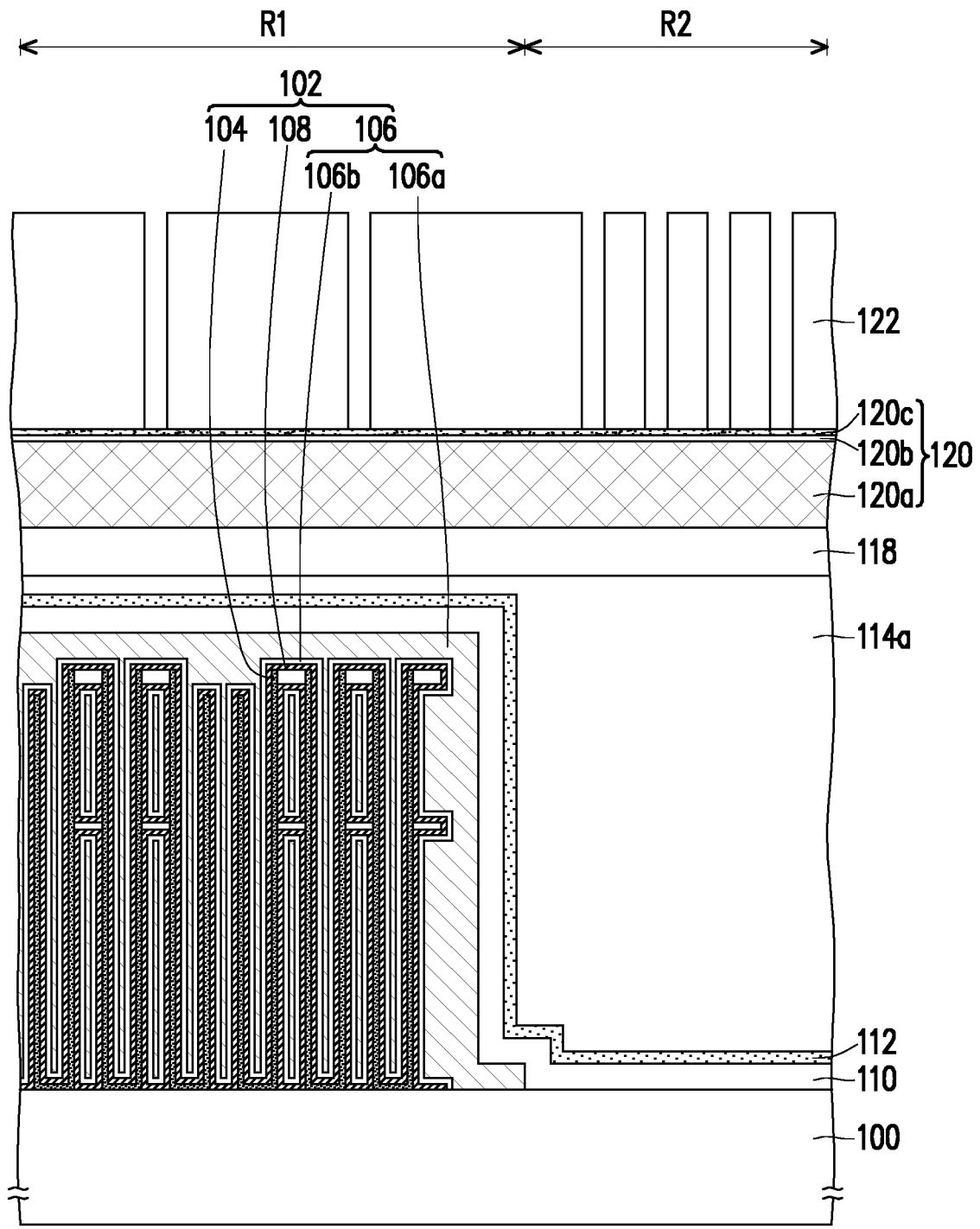

Referring to FIG. 1D, the patterned photoresist layer 116 may be removed. A chemical mechanical polishing (CMP) process may be performed on the planarization material layer 114 to form a planarization layer 114a on the stop layer 112. Referring to 1E, a dielectric layer 118 may be formed on the planarization layer 114a. The material of the dielectric layer 118 is, for example, oxide (e.g., silicon oxide, such as SOG or BPSG) or nitride (e.g., silicon nitride or silicon oxynitride). The dielectric layer 118 can be used to repair defects (e.g., scratches) on the planarization layer 114a after the CMP process. A hard mask material layer 120 may be formed on the dielectric layer 118. In other embodiments, if the dielectric layer 118 is omitted, the hard mask material layer 120 may be directly formed on the planarization layer 114a. The hard mask material layer 120 may be a single-layer structure or a multilayer structure. In the present embodiment, the hard mask material layer 120 is, for example, a multilayer structure. The material of the hard mask material layer 120 is, for example, polysilicon, carbon (e.g., spin on carbon (SOC)), silicon oxynitride, silicon oxide, or spin on silicon anti-reflection coating (SOSA). For example, the hard mask material layer 120 may include a mask layer 120a, a mask layer 120b, and a mask layer 120c. The mask layer 120a is located on the dielectric layer 118. The material of the mask layer 120a is, for example, carbon. The mask layer 120b is located on the mask layer 120a. The material of the mask layer 120b is, for example, silicon oxynitride (SiON). The mask layer 120c is located on the mask layer 120b. The material of the mask layer 120c is, for example, silicon oxide. A patterned photoresist layer 122 may be formed on the hard mask material layer 120. The patterned photoresist layer 122 may expose a portion of the hard mask material layer 120 in the memory array region R1 and the peripheral circuit region R2.

Figure 1F:
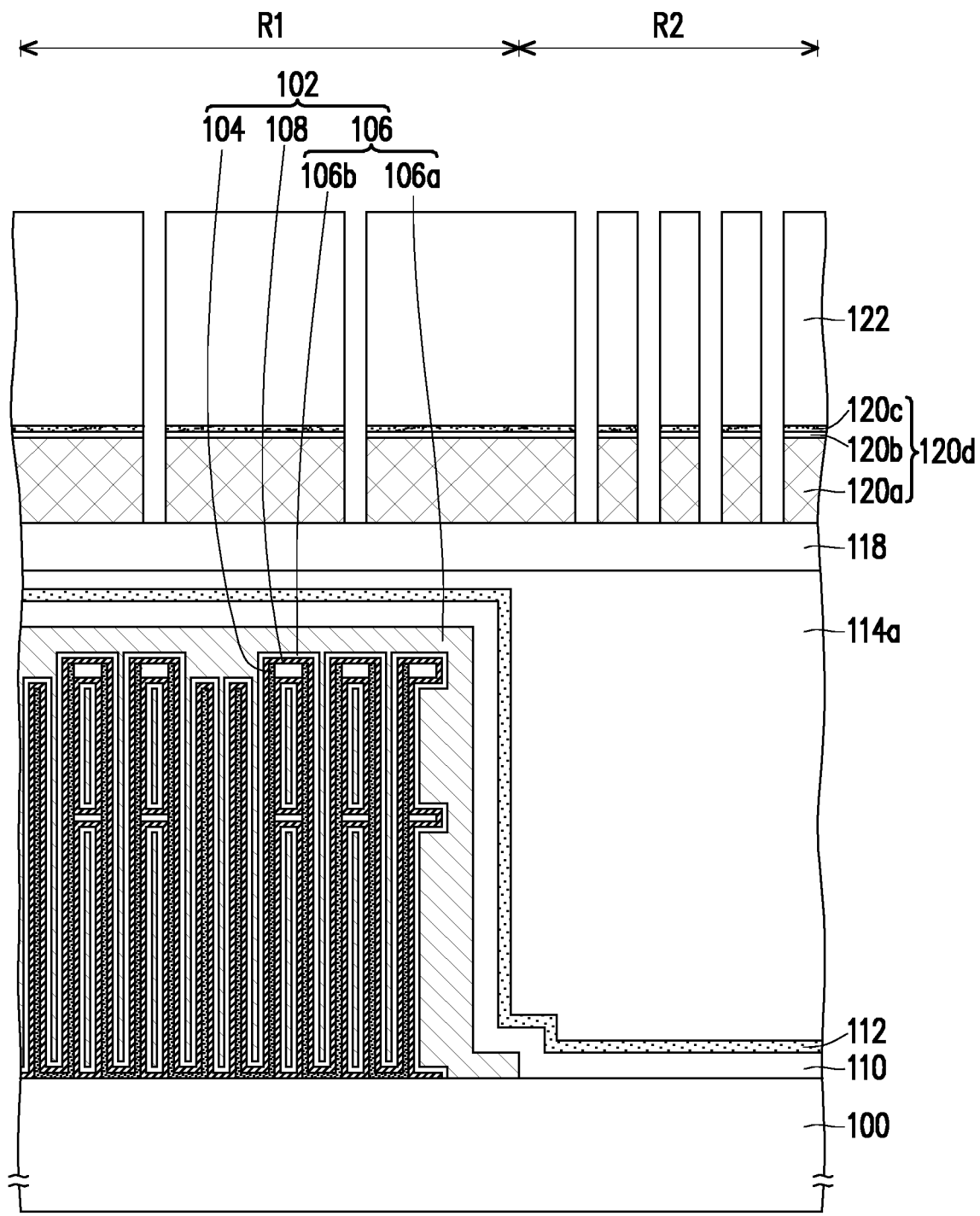

Referring to FIG. 1F, a portion of the hard mask material layer 120 is removed by using the patterned photoresist layer 122 as a mask to form a patterned hard mask layer 120d on the dielectric layer 118.

Figure 1G:
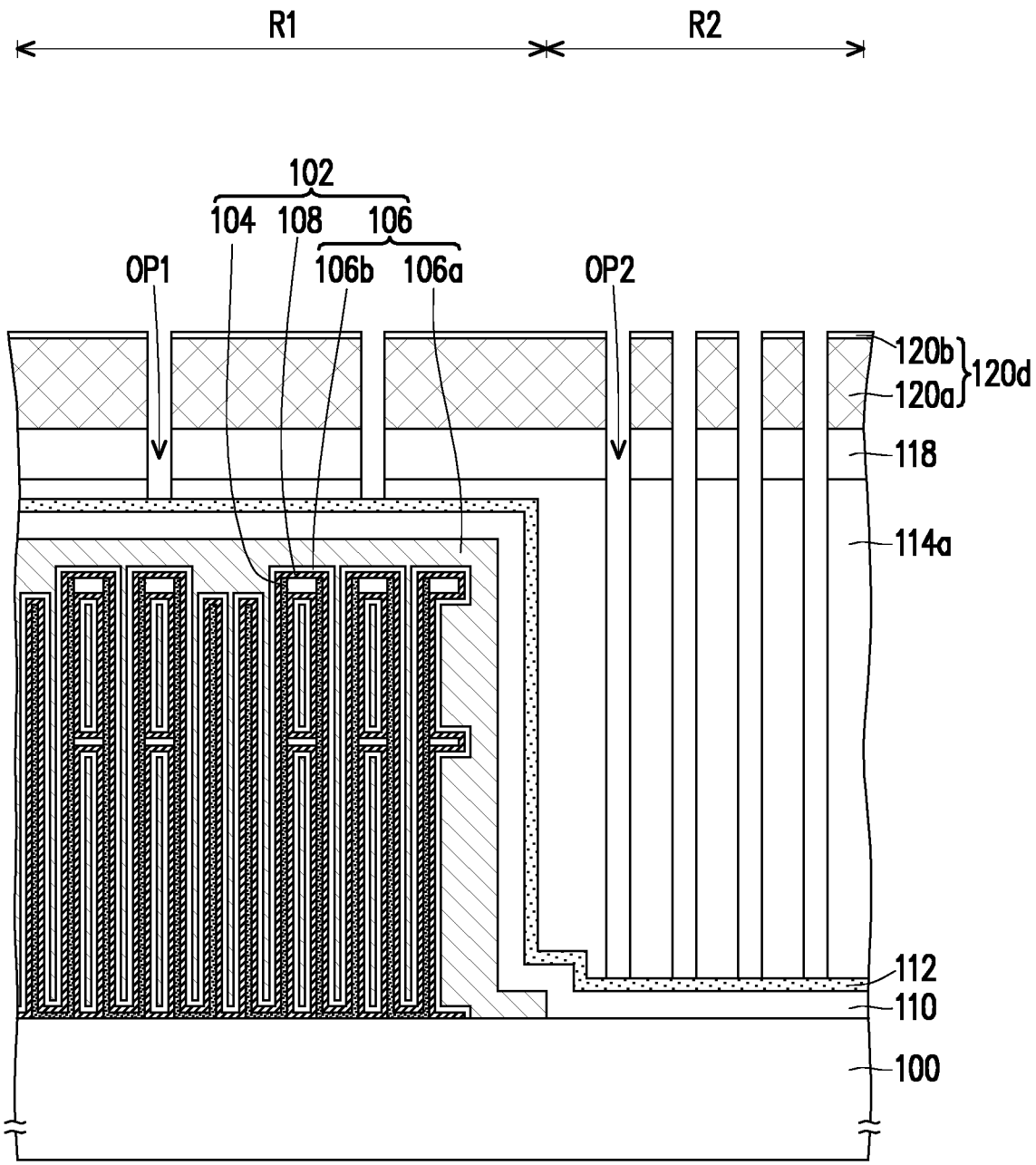

Referring to FIG. 1G, the patterned photoresist layer 122 may be removed. A portion of the dielectric layer 118 and a portion of the planarization layer 114a are removed by using the patterned hard mask layer 120d as a mask until the stop layer 112 is exposed. Thereby, an opening OP1 passing through the dielectric layer 118 and the planarization layer 114a may be formed in the memory array region R1, and an opening OP2 passing through the dielectric layer 118 and the planarization layer 114a may be formed in the peripheral circuit region R2. In addition, in the process of removing the portion of the dielectric layer 118 and the portion of the planarization layer 114a, the mask layer 120c may be simultaneously removed. The method of removing the portion of the dielectric layer 118 and the portion of the planarization layer 114a is, for example, a dry etching method.

In the process of removing the portion of the planarization layer 114a, the removal rate of the planarization layer 114a may be greater than the removal rate of the stop layer 112. For example, the stop layer 112 may be used as an etching stop layer in an etching process for removing the portion of the dielectric layer 118 and the portion of the planarization layer 114a. In the etching process for removing the portion of the planarization layer 114a, since the etching rate of the stop layer 112 is much lower than the etching rate of the planarization layer 114a, the opening OP1 and the opening OP2 can be sequentially formed by the etching process, and the etching process can successfully stop on the stop layer 112 exposed by the opening OP1 and on the stop layer 112 exposed by the opening OP2.

Figure 1H:
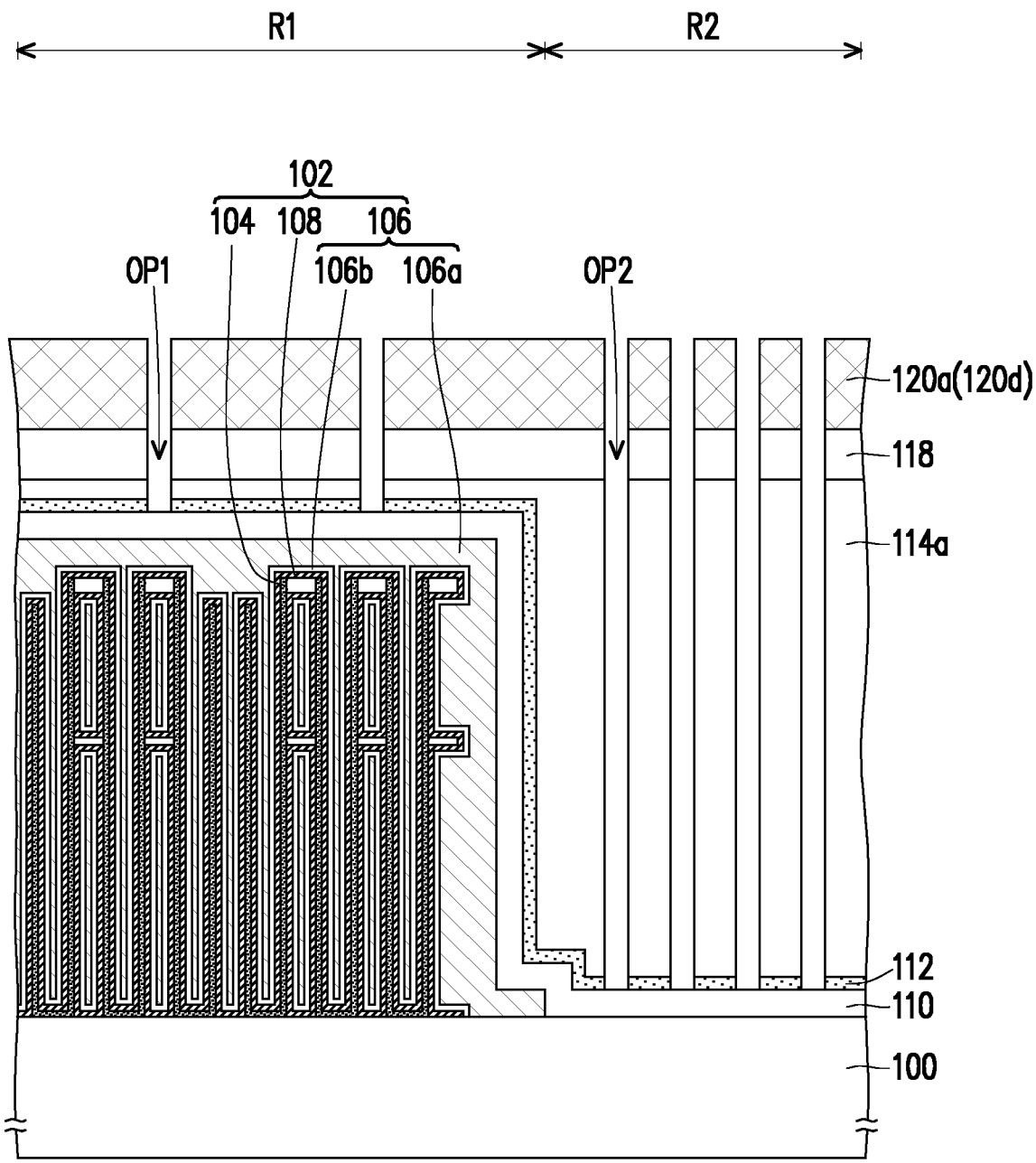

Referring to FIG. 1H, a portion of the stop layer 112 is removed by using the patterned hard mask layer 120d as a mask until the buffer layer 110 is exposed. Thereby, the opening OP1 may further pass through the stop layer 112 in the memory array region R1, and the opening OP2 may further pass through the stop layer 112 in the peripheral circuit region R2. In the process of removing the portion of the stop layer 112, the removal rate of the stop layer 112 may be greater than the removal rate of the buffer layer 110. For example, in the etching process for removing the portion of the stop layer 112, the etching rate of the stop layer 112 may be greater than the etching rate of the buffer layer 110. Moreover, in the process of removing the portion of the stop layer 112, the mask layer 120b may be simultaneously removed. The method of removing the portion of the stop layer 112 is, for example, a dry etching method.

Figure 1I:
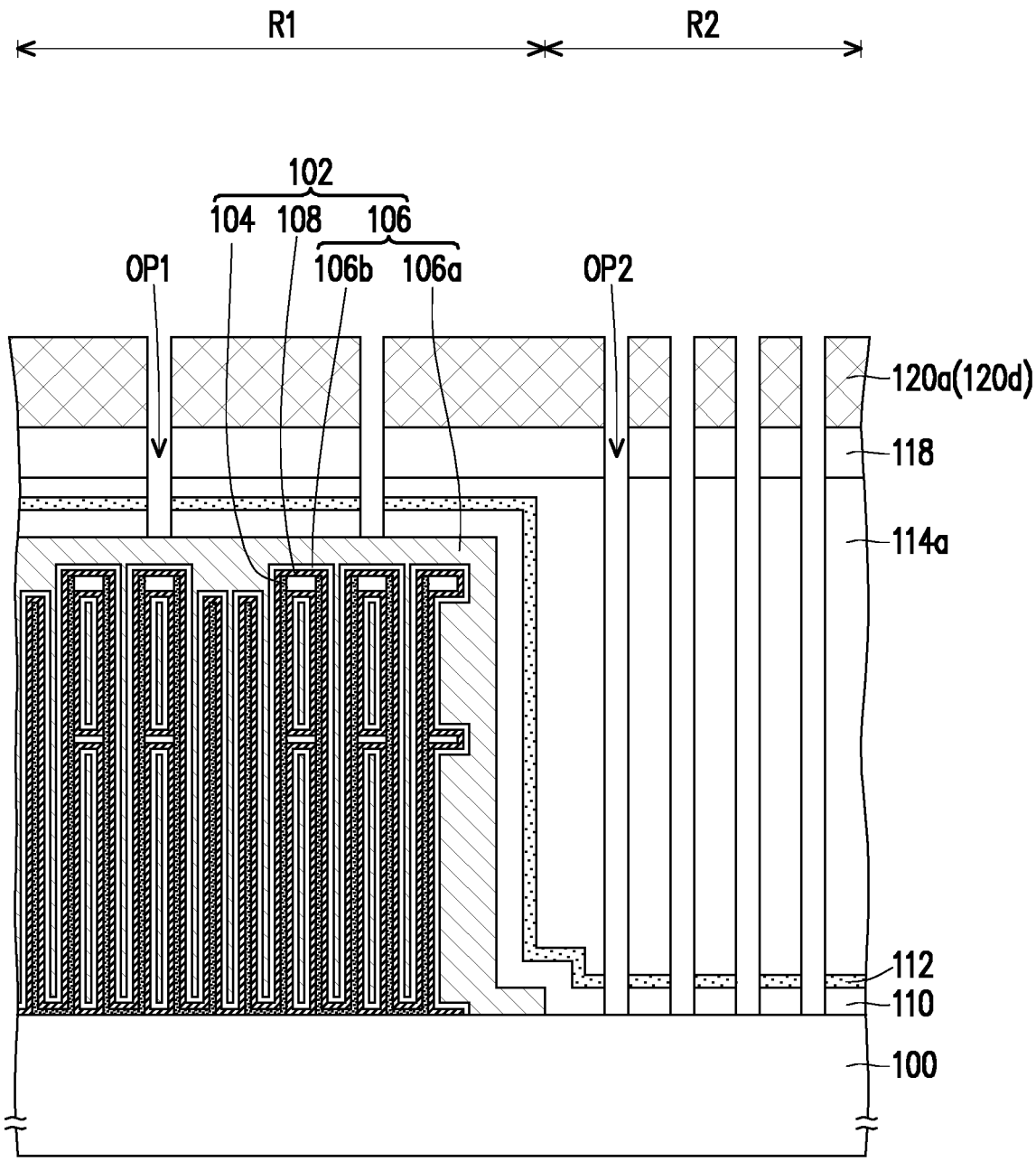

Referring to FIG. 1I, a portion of the buffer layer 110 is removed by using the patterned hard mask layer 120d as a mask until the electrode 106 in the memory array region R1 and the substrate 100 in the peripheral circuit region R2 are exposed. The method of removing the portion of the buffer layer 110 is, for example, a dry etching method. By the above method, the opening OP1 passing through the dielectric layer 118, the planarization layer 114a, the stop layer 112, and the buffer layer 110 may be formed in the memory array region R1, and the opening OP2 passing through the dielectric layer 118, the planarization layer 114a, the stop layer 112, and the buffer layer 110 may be formed in the peripheral circuit region R2.

In addition, the etching process for forming the opening OP1 and the opening OP2 may be continuously performed by changing the etching gas. Furthermore, since the buffer layer 110 can be used as an etching stop layer in the etching process of removing the portion of the stop layer 112, the damage to the electrode 106 caused by the etching process can be effectively suppressed.

Figure 1J:
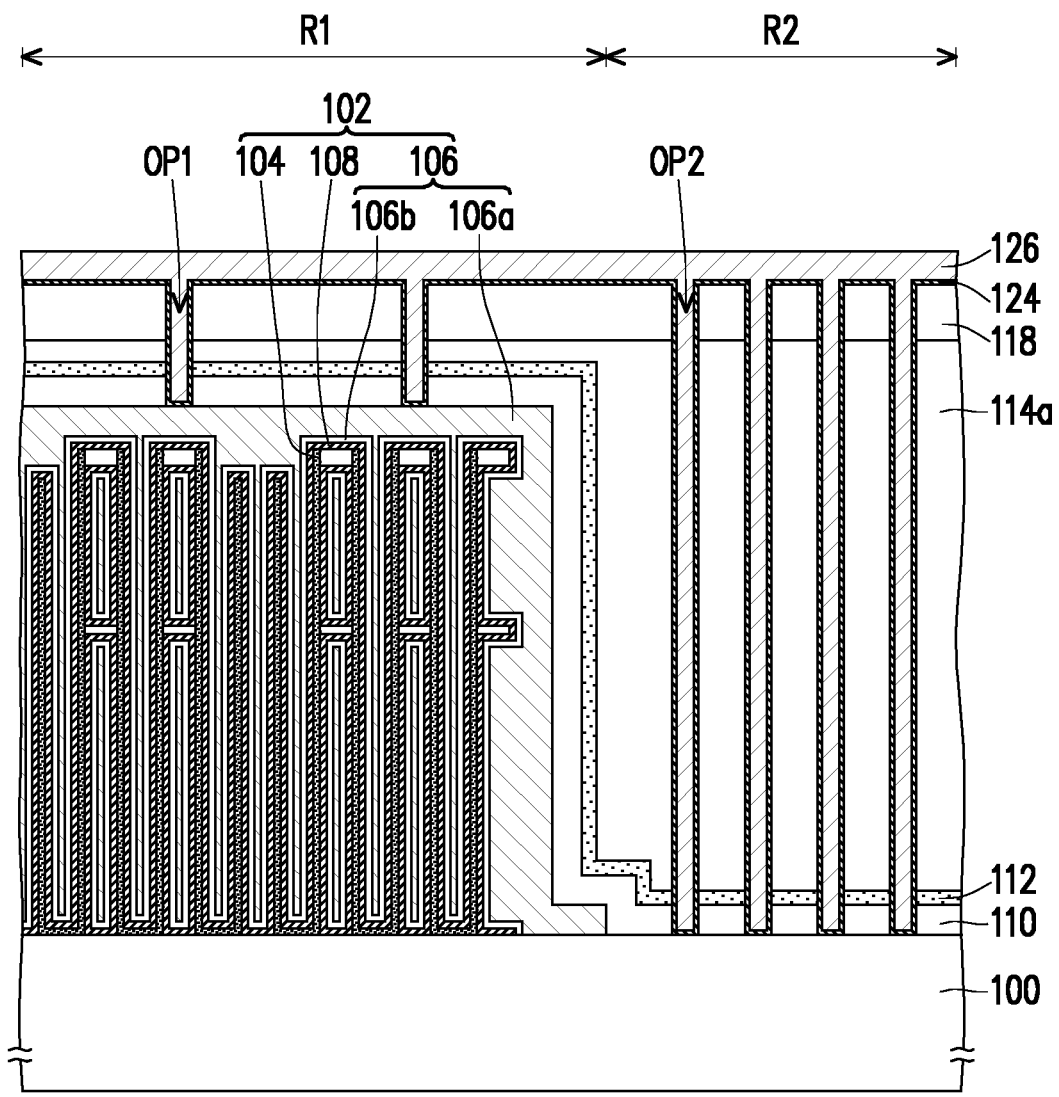

Referring to FIG. 1J, the patterned hard mask layer 120d may be removed. In the case where the material of the mask layer 120a is carbon, the mask layer 120a may be removed by an ashing process. A barrier material layer 124 is conformally formed on the surface of the opening OP1 and the surface of the opening OP2. The material of the barrier material layer 124 is, for example, titanium, titanium nitride, or a combination thereof. A contact material layer 126 filling in the opening OP1 and the opening OP2 is formed. The material of the contact material layer 126 is, for example, tungsten.

Figure 1K:
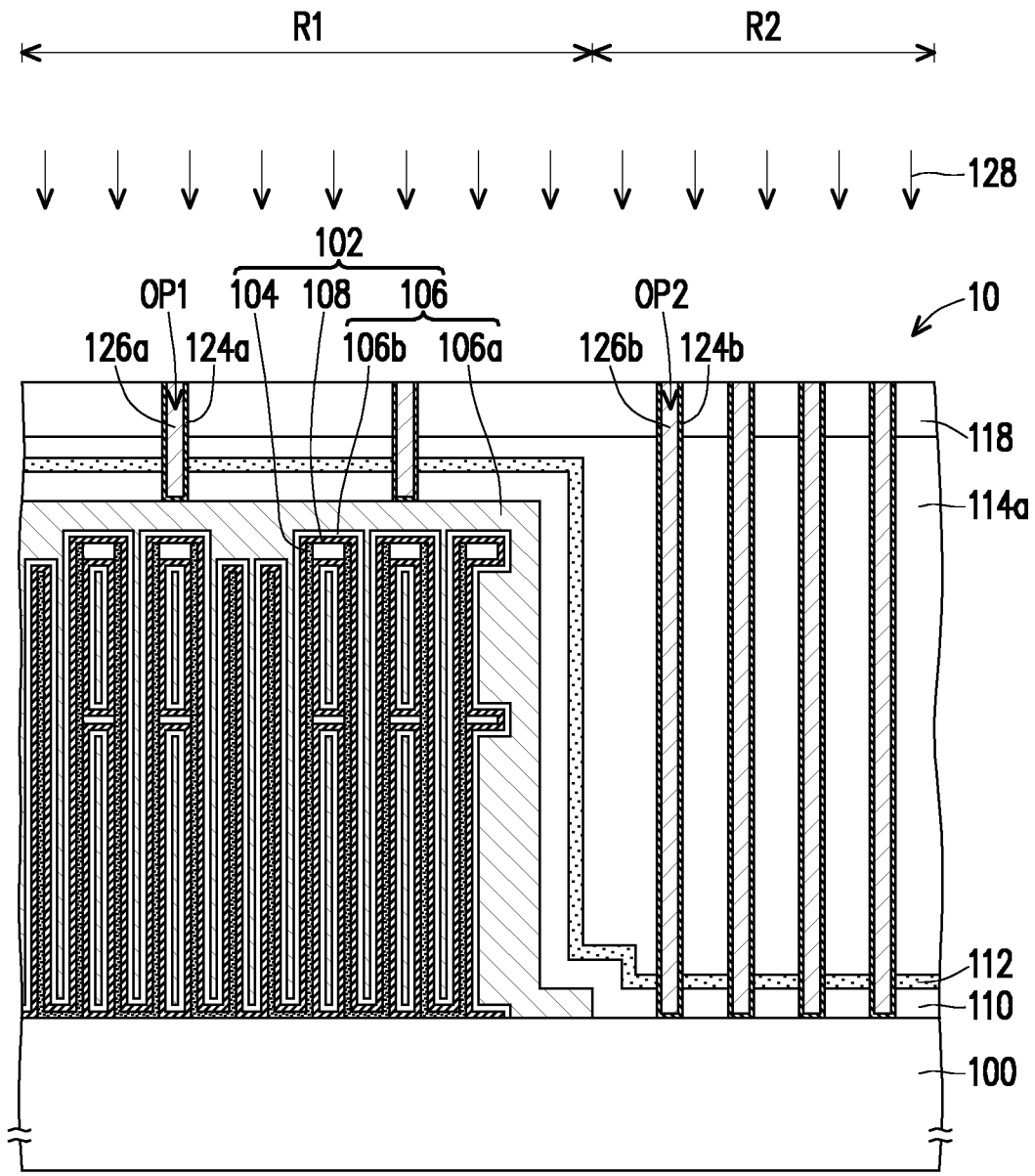

Referring to FIG. 1K, the contact material layer 126 and the barrier material layer 124 outside the opening OP1 and the opening OP2 are removed to form a contact 126a and a barrier layer 124a in the opening OP1 and to form a contact 126b and a barrier layer 124b in the opening OP2. Thereby, the contact 126a may be formed in the memory array region R1, and the contact 126b may be formed in the peripheral circuit region R2, but the method of forming the contact 126a and the contact 126b is not limited to the above method. The contact 126a and the contact 126b pass through the dielectric layer 118, the planarization layer 114a, the stop layer 112, and the buffer layer 110. The contact 126a is electrically connected to the electrode 106 of the capacitor 102. In addition, the contact 126a may be electrically connected to an active device (e.g., a sense amplifier) on the substrate 100. A $H_2$ sintering process 128 may be performed, which can reduce the dangling bonds on the substrate 100, thereby increasing the electrical performance of the semiconductor device.

Hereinafter, the semiconductor device 10 of the above embodiment is described with reference to FIG. 1K. The semiconductor device 10 includes a substrate 100, a capacitor 102, a stop layer 112, a contact 126a, and a contact 126b.

The semiconductor device 10 may be a DRAM. The substrate 100 includes a memory array region R1 and a peripheral circuit region R2. The capacitor 102 is located in the memory array region R1. The capacitor 102 includes an electrode 104, an electrode 106, and an insulating layer 108. The electrode 104 is located on the substrate 100. The electrode 106 is located on the electrode 104. The electrode 106 may be a single-layer structure or a multilayer structure. In the present embodiment, the electrode 106 is, for example, a multilayer structure. For example, the electrode 106 may include a conductive layer 106a and a conductive layer 106b. The conductive layer 106b is located between the conductive layer 106a and the insulating layer 108. The insulating layer 108 is located between the electrode 104 and the electrode 106. The stop layer 112 is located on the electrode 106 in the memory array region R1 and extends into the peripheral circuit region R2. The stop layer 112 may extend along the sidewall of the capacitor 102. The stop layer 112 includes a first portion located on the electrode 106 in the memory array region R1 and a second portion located in the peripheral circuit region R2, wherein the first portion extends to the second portion, and the top surface of the first portion is higher than the top surface of the second portion. The material of the stop layer 112 is not a conductive material. The contact 126a is located in the memory array region R1, passes through the dielectric layer 118, the planarization layer 114a, the stop layer 112, and the buffer layer 110, and is electrically connected to the electrode 106. The contact 126b is located in the peripheral circuit region R2 and passes through the dielectric layer 118, the planarization layer 114a, the stop layer 112, and the buffer layer 110.

Furthermore, the semiconductor device 10 may further include at least one of a buffer layer 110, a planarization layer 114a, a dielectric layer 118, a barrier layer 124a, and a barrier layer 124b. The buffer layer 110 is located in the memory array region R1 and the peripheral circuit region R2, and is located between the stop layer 112 and the electrode 106. The planarization layer 114a is located on the stop layer 112. The dielectric layer 118 is located on the planarization layer 114a. The barrier layer 124a is located between the contact 126a and the electrode 106. The barrier layer 124b is located between the contact 126b and the substrate 100.

Based on the above embodiments, in the semiconductor device 10 and the manufacturing method thereof, since the stop layer 112 can be used as an etching stop layer in the process of forming the contact 126a and the contact 126b, there is no need to increase the thickness of the electrode 106. Therefore, the electrode 106 can have better uniformity between different memory array regions R1, thereby effectively increasing the electrical performance of the semiconductor device 10. In addition, since the material of the stop layer 112 is not the conductive material, the stop layer 112 will not hinder the $H_2$ sintering process 128, and the electrical performance of the semiconductor device 10 can be increased by the $H_2$ sintering process 128.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor device, comprising:
   a substrate comprising a memory array region and a peripheral circuit region;
   a capacitor located in the memory array region and comprising:
   a first electrode located on the substrate;
   a second electrode located on the first electrode; and
   an insulating layer located between the first electrode and the second electrode;
   a stop layer comprising a first portion located on the second electrode in the memory array region and a second portion located in the peripheral circuit region, wherein the first portion extends to the second portion, a material of the stop layer is not a conductive material, and a top surface of the first portion is higher than a top surface of the second portion;
   a first contact located in the memory array region, passing through the stop layer, and electrically connected to the second electrode; and
   a second contact located in the peripheral circuit region and passing through the stop layer, wherein
   the second electrode comprises a multilayer structure, and the second electrode comprises:
   a first conductive layer, wherein a material of the first conductive layer comprises a doped semiconductor material; and
   a second conductive layer located between the first conductive layer and the insulating layer, wherein a material of the second conductive layer comprises titanium, titanium nitride, or a combination thereof.

2. The semiconductor device according to claim 1, wherein the stop layer extends along a sidewall of the capacitor.

3. The semiconductor device according to claim 1, further comprising:
   a buffer layer located in the memory array region and the peripheral circuit region and located between the stop layer and the second electrode, wherein a material of the buffer layer comprises oxide, and a material of the stop layer comprises nitride.

4. The semiconductor device according to claim 1, further comprising:
   a planarization layer located on the stop layer, wherein a material of the planarization layer comprises oxide, and a material of the stop layer comprises nitride.

5. The semiconductor device according to claim 4, further comprising:
   a dielectric layer located on the planarization layer.

6. The semiconductor device according to claim 1, further comprising:
   a first barrier layer located between the first contact and the second electrode; and
   a second barrier layer located between the second contact and the substrate.

7. A semiconductor device, comprising:
   a substrate comprising a memory array region and a peripheral circuit region;
   a capacitor located in the memory array region and comprising:
   a first electrode located on the substrate;
   a second electrode located on the first electrode; and
   an insulating layer located between the first electrode and the second electrode;
   a stop layer comprising a first portion located on the second electrode in the memory array region and a second portion located in the peripheral circuit region, wherein the first portion extends to the second portion, a material of the stop layer is not a conductive material, and a top surface of the first portion is higher than a top surface of the second portion;
   a first contact located in the memory array region, passing through the stop layer, and electrically connected to the second electrode;
   a second contact located in the peripheral circuit region and passing through the stop layer;
   a buffer layer located in the memory array region and the peripheral circuit region and located between the stop layer and the second electrode; and
   a planarization layer located on the stop layer, wherein
   a material of the stop layer is different from a material of the buffer layer and a material of the planarization layer.

8. The semiconductor device according to claim 7, wherein the material of the stop layer comprises nitride, the material of the buffer layer comprises oxide, and the material of the planarization layer comprises oxide.

9. The semiconductor device according to claim 7, wherein the stop layer extends along a sidewall of the capacitor.

10. The semiconductor device according to claim 7, wherein the second electrode comprises a single-layer structure.

11. The semiconductor device according to claim 7, wherein the second electrode comprises a multilayer structure.

12. The semiconductor device according to claim 11, wherein the second electrode comprises:
    a first conductive layer, wherein a material of the first conductive layer comprises a doped semiconductor material; and
    a second conductive layer located between the first conductive layer and the insulating layer, wherein a material of the second conductive layer comprises titanium, titanium nitride, or a combination thereof.

13. The semiconductor device according to claim 7, further comprising:
    a dielectric layer located on the planarization layer.

14. The semiconductor device according to claim 7, further comprising:
    a first barrier layer located between the first contact and the second electrode; and
    a second barrier layer located between the second contact and the substrate.

* * * * *